Dec. 9, 1969 G. F. DULIN 3,483,440

PLASTIC COATED SEMICONDUCTOR DEVICE FOR HIGH-VOLTAGE LOW-PRESSURE APPLICATION

Filed Sept. 8, 1966

INVENTOR.
GERALD F. DULIN

BY

OSTROLENK, FABER, GERB & SOFFEN

ATTORNEYS 3,483,440

PLASTIC COATED SEMICONDUCTOR DEVICE FOR HIGH-VOLTAGE LOW-PRESSURE APPLICATION

Gerald F. Dulin, Torrance, Calif., assignor to International Rectifier Corporation, El Segundo, Calif., a corporation of California Filed Sept. 8, 1966, Ser. No. 577,923
Int. Cl. H01l 3/12
U.S. Cl. 317—234 3 Claims

ABSTRACT OF THE DISCLOSURE

A top hat diode having a thin insulation coating extending from an outer periphery of its bottom flange and around the outer surface thereof and extending above the crimp in the upper lead thereof in order to prevent flashover at low atmospheric pressures.

This invention relates to a novel construction and process for the manufacture of semiconductor devices such as rectifier diodes, and more specifically relates to a novel structure and process for permitting the use of standard semiconductor devices in high-voltage low-pressure applications.

This invention is an improvement of the copending application Ser. No. 439,251, filed Mar. 12, 1965, in the name of Diebold, and assigned to the assignee of the present invention, now U.S. Patent 3,409,808.

Rectifier diodes using solid state junctions in silicon or germanium crystals are extremely well known to the art, and have been continuously improved over the years. Thus, these devices were originally built for voltages in the range of 100 volts, and gradually, as techniques for manufacture of the devices have improved, the voltage capability of the devices have been increased to in excess of 1,000 volts.

The package, or metallic case, which contains this diode is presently a standardized component and has been in use for many years. This metallic case is well known, and is termed as a "top hat" construction. This original package operates satisfactorily at the low voltage ratings at which the devices were originally designed, particularly where the device was used at full atmospheric pressure. More recently, however, diodes of this type are being applied not only at higher voltages, but also in high altitude or low atmospheric pressure applications. Under these circumstances, very severe flashover problems have been encountered.

The principal object of this invention is to provide a novel diode package which can operate at high voltage and low atmospheric pressure without electrical flashover.

Yet another object of this invention is to provide a novel external insulation housing for standard rectifier diodes which permits their use in high-voltage, low-pressure applications.

Still another object of this invention is to provide an insulation sheath over the full surface of a standardized rectifier diode housing, with the exception of the main heat exchange surface of the housing flange.

Yet another object of this invention is to provide full electrical insulation over the surface of a high-voltage diode for use with low-pressure applications which does not add thermal insulation against heat transfer.

A still further object of this invention is to provide a novel process for the formation of an insulation coating over the surface of a high voltage semiconductor device.

These and other objects of this invention will become apparent from the following description when taken in connection with the drawings, in which.

Figure 1:
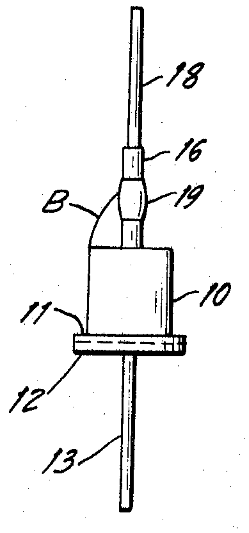
FIGURE 1 is a side view of a typical "top hat" rectifier diode.
Figure 2:
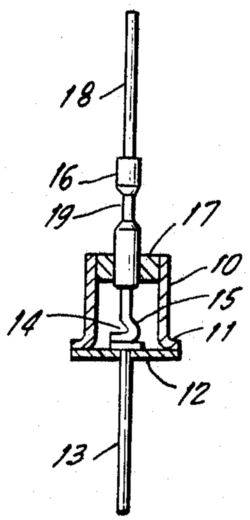
FIGURE 2 is a side view of FIGURE 1 partially in cross-section to illustrate the internal construction of the device.
Figure 3:
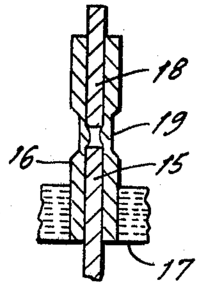
FIGURE 3 is an enlarged view in cross-section of the crimping tube for connecting the lead coming from the wafer of the rectifier diode to an external connection lead.

Referring first to FIGURES 1, 2 and 3, I have illustrated therein a typical prior art type of "top hat" rectifier diode. More particularly, the device is comprised of an outer conductive housing 10 having an extending flange 11 which is connected to a metallic disk 12. The metallic disk 12 which is connected to flange 11 is electrically connected to a first lead 13. Note that the bottom of disk 12 serves as a heat exchange surface, and might be mounted immediately against some suitable metallic body which will serve as the heat sink for the device.

The upper surface of disk 12 is then connected to a suitable semiconductor wafer 14 (FIGURE 2) which will have a rectifying junction therein. The upper surface of wafer 14 is then connected to a suitable internal lead 15, and the lead 14 then extends into a metallic tube 16.

The metallic tube 16 is rigidly secured to an annular insulation ring 17 which could be a glass bead, and serves to provide the insulation between the two electrical terminals of the device.

The metallic tube 16 then receives an external lead 18 in the other end thereof which is of material suitable for an external lead connector, and the leads 15 and 18 are mechanically and electrically connected together by a crimp 19 placed in the tube 16.

In considering the diode of FIGURES 1, 2 and 3, under conditions of normal atmospheric pressure, the flashover at atmospheric pressure is characterized by the very good insulating properties of air. Thus, theoretically, 0.03 centimeter of flashover distance is sufficient to hold voltages up to 1,000 volts. As a practical matter, this distance is too short, and for example, in the diode of FIGURES 1, 2 and 3, the radial dimension over the surface of the insulation bead 17 will be approximately 0.14 centimeter, which is approximately five times more than the theoretical minimum.

However, another insulation problem exists other than direct flashover in the standard type of diode of FIGURES 1, 2 and 3 at full atmospheric pressure. Thus, the exposed surface insulator 17 is exposed to atmospheric contaminants such as dust, humidity, chemically aggressive vapors, and so on, which could produce a break-down path along the surface of the insulator. For this reason, the insulating distance traditionally provided in such diodes is too short and are acceptable only because the diodes are not normally used at their maximum voltage rating, but are used at approximately ⅓ to ½ of their rating.

Since, however, these distances are too short, it has been common practice by users of diodes to apply an insulation sleeve surrounding the diode casing 10 to prevent contaminants from coating the upper insulation surface of bead 17.

If now this same diode, whether bare or with an insulating sleeve, is taken down to a low pressure such as 8 millimeters of mercury, corresponding, for example, to very high altitudes, it has been found that the diode will flash over externally, as indicated by line B of FIGURE 1. This flashover arc does not follow across the surface of insulator bead 17, but rather extends in a relatively straight line between two sharp corners, one of which is formed by the rim of the insulated case of the diode and the other which is formed by the flattened crimp 19. Indeed, and even where the diode is provided with an insulation sleeve over surface 17, and even where the sleeve shrinks closely to the diode surface, it has been found that this arc will nevertheless flash over inside of the sleeve. If the sleeve is tightly fitted, this flashover has been found to occur several seconds after the voltage is applied. The observed minimum flashover voltage is further found to be very low compared to the flashover voltage under atmospheric pressure.

This behavior can be expected from Paschens Law. More particularly, for two spherical electrodes spaced from one another in air, the flashover voltage will vary as a function of the product of air pressure and distance, where the pressure is expressed in millimeters of mercury and the distance between the electrodes is expressed in centimeters.

Thus, if a certain voltage must be held with certainty such as 1,000 volts, and 1,400 volts is the minimum actual flashover voltage, the product X of pressure times distance must be 14.

For present-day high altitude aircraft, the minimum pressure encountered will be of the order of 8 millimeters of mercury, which is approximately 1% of normal atmospheric pressure. Thus, this corresponds to a distance of 1.75 centimeters between spherical electrodes.

The distance between the flashover points in FIGURE 1, however, is not nearly this distance, and indeed is only of the order of 0.14 centimeter, so that at low pressure, the normal diode package would be too small and indeed would still be too small even if it were entirely made of insulation material. That is to say, even if the complete housing 10 were of insulation material, its length would still be substantially less than the required length of 1.75 centimeters.

It should be noted that for even higher altitudes, and where the pressure is still lower, regardless of the spacing between electrodes, there is a minimum voltage of approximately 360 volts where flashover will occur whenever the variable X of FIGURE 6 is of the order of 0.5. Thus, when traveling between atmosphere and outer space, there is a region within which any insulation will flash over externally regardless of how long the flashover distance is made, so long as the voltage is higher than 360 volts. This problem can be overcome only by completely immersing the high voltage system in an insulation medium, either liquid or solid, so that no atmosphere can reach the electrically live parts.

In accordance with the invention, a novel arrangement is provided for surrounding the external surfaces of the standardized "top hat" device so that the device can operate at low pressures without the problem of flashover discussed heretofore.

Figure 4:
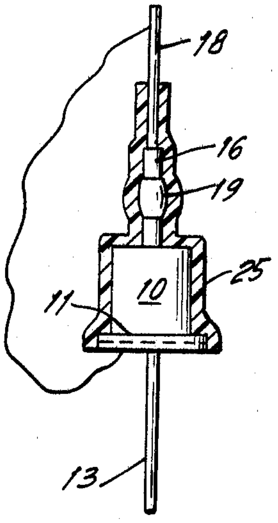
FIGURE 4 illustrates the rectifier diode of FIGURE 1 and schematically illustrates the plastic coating applied thereto in accordance with the present invention.

More specifically and as illustrated in FIGURE 4, the "high hat" diode of FIGURE 4 is coated with an epoxy coating 25 which extends from the periphery of the bottom of disk 12, over flange 11, beyond crimp 19, terminating approximately 0.5 centimeter above the top of tube 16. The thickness of the epoxy coating 25 is approximately 0.025 centimeter.

As an important feature of the invention and as shown in FIGURE 4, diode flashover will occur from base 12 to the portion of lead 18, above the end of coating 25, which is a distance of approximately 1.75 centimeters when the "top hat" diode is Type No. IN561. This increased flashover distance is of great importance where the diode is to be used at high voltages in a low-voltage environment. Moreover, the structure of FIGURE 4 still has the exposed metallic flange 11 available for heat dissipation as by soldering or clamping to a chassis or piece of electronic equipment. Thus, the electrical insulation is provided only on those parts of the diode where its presence does not add thermal insulation against heat transfer.

The foregoing description of the invention is made in connection with "top hat" diodes where the advantage of an exposed metallic surface for heat exchange is retained. However, the invention is also generally applicable to tubular electrical components such as flangeless diodes having a metallic case, or glass diodes where the leads of the device extend from the opposite ends of the device. A typical arrangement of this type is shown in FIGURE 5 where a flangeless diode housing 50 having leads 51 and 52 is shown in plane view.

Figure 5:
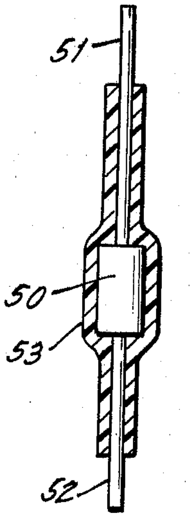
FIGURE 5 illustrates the manner in which the invention can be applied to a flangeless type of semiconductor device.

In the case of FIGURE 5, the epoxy coating 53 having a thickness of approximately 0.025 centimeter overlaps the ends of housing 50 as shown thereby to force a flashover path to extend from the exposed ends of leads 51 and 52 just above the termination of the epoxy coating.

An important feature of the invention lies in the process for applying the coating 25 in FIGURE 4 and 53 in FIGURE 5. In each instance, the novel process includes the steps of initially applying a release coating to the end portions of leads 13 and 18 and the bottom of base 12 in FIGURE 4 where coating is not desired. Similarly, the outer ends of leads 51 and 52 in FIGURE 5 would receive a release coating which could be of any standard type.

Thereafter, the entire device is preheated to about 175° C. by placing the device in a suitable oven for a suitable length of time. The preheated device is thereafter dipped into a bath of vibrating epoxy powder so that the epoxy powder will coagulate on the heated surface of the device until a layer of sufficient thickness is built on the device.

Satisfactory results have been obtained with the use of a "Vibra-Coater" which is a device manufactured by the Hysol Corporation of California (Model 4396). This device provides a chamber for a suitable epoxy powder and means for vibrating the powder so that a heated object immersed in the powder will receive a smooth continuous coating of the powder thereon. A suitable epoxy powder which has been used with the present invention is manufactured under the name Hysol DK4.

When using this equipment, the device of FIGURE 4 or 5, preheated to 175° C., is dipped into the epoxy powder contained in the vibration coater and immersed in the powder for approximately 30 seconds. At the end of this time, a coating of approximately 0.025 inch in thickness is built up around the surface uncovered by release agent and the device is thereafter removed from the coater and cured in an oven at 175° C. for approximately 40 minutes and until the coating becomes transparent.

Although there has been described a preferred embodiment of this novel invention, many variations and modifications will now be apparent to those skilled in the art. Therefore, this invention is to be limited, not by the specific disclosure herein, but only be the appending claims.

The embodiments of the invention in which an exclusive privilege or property is claimed are defined as follows:

1. A high voltage device comprising a hermetically sealed conductive housing for a semiconductor body, a pair of conductive lead wires extending from opposite ends of said housing, an insulation spacer means contained within said housing for electrically insulating a current path between said pair of lead wires through said conductive housing, and an insulation sheath continuously extending at least from one end of said housing over the full surface thereof to the opposite end thereof and up one of said leads extending from said opposite end thereof for at least 0.5 centimeter from said opposite end of said housing; said one of said leads including a crimp section therein; said coating covering said crimp section and extending beyond the end of said crimp section; said insulation coating having a substantially uniform thickness of approximately 0.025 centimeter over its entire length.

2. The device as set forth in claim 1 wherein said insulation coating extends below the said one end of said housing and down said lead extending from said one end of said housing for approximately 0.5 centimeter.

3. The device as set forth in claim 1 wherein said one end of said housing includes an extending conductive flange; the bottom surface of said flange being free of said coating; the top surface of said flange being covered with said coating.

References Cited

UNITED STATES PATENTS

| | | | |
|---|---|---|---|
| 2,681,398 | 6/1954 | Kozacka et al. | 174—52.6 |
| 3,261,902 | 7/1966 | Pearce et al. | 317—234 X |
| 3,328,644 | 6/1967 | Barrling | 317—234 X |
| 3,404,356 | 10/1968 | Keller | 317—234 X |
| 3,409,808 | 11/1968 | Diebold | 317—234 |

JAMES D. KALLAM, Primary Examiner
R. F. POLISSACK, Assistant Examiner

U.S. Cl. X.R.

174—52